United States Patent
Jewett et al.

(10) Patent No.: US 6,291,938 B1
(45) Date of Patent: Sep. 18, 2001

(54) METHODS AND APPARATUS FOR IGNITING AND SUSTAINING INDUCTIVELY COUPLED PLASMA

(75) Inventors: Russell F. Jewett, Charlotte, NC (US); Curtis C. Camus, Fort Collins, CO (US)

(73) Assignee: Litmas, Inc., Matthews, NC (US)

( * ) Notice: Subject to any disclaimer, the term of this patent is extended or adjusted under 35 U.S.C. 154(b) by 0 days.

(21) Appl. No.: 09/490,696

(22) Filed: Jan. 24, 2000

Related U.S. Application Data

(60) Provisional application No. 60/174,110, filed on Dec. 31, 1999.

(51) Int. Cl.⁷ .................................................. H01J 7/24
(52) U.S. Cl. ........................... 315/111.51; 315/111.21; 315/111.41; 219/121 R; 156/345
(58) Field of Search ...................... 315/111.21, 111.41, 315/111.51; 219/121 R; 156/345

(56) References Cited

U.S. PATENT DOCUMENTS

| | | |
|---|---|---|
| 3,862,393 | 1/1975 | Dundas et al. ................... 219/121 R |
| 3,909,736 | 9/1975 | Huchital et al. ...................... 330/4.3 |
| 5,223,457 | 6/1993 | Mintz et al. . |
| 5,383,019 | 1/1995 | Farrell et al. ......................... 356/316 |
| 5,397,962 | 3/1995 | Moslehi ........................... 315/111.51 |
| 5,449,432 | 9/1995 | Hanawa ............................... 156/343 |
| 5,460,707 | 10/1995 | Wellerdieck ..................... 204/298.08 |
| 5,468,296 | 11/1995 | Patrick et al. ................. 118/723 MP |
| 5,506,475 | * 4/1996 | Alton ............................. 315/111.41 |
| 5,578,165 | 11/1996 | Patrick et al. .................... 156/643.1 |
| 5,639,519 | 6/1997 | Patrick et al. ......................... 427/569 |
| 5,685,941 | 11/1997 | Forster et al. ....................... 156/345 |
| 5,815,047 | 9/1998 | Sorensen et al. ................... 333/17.3 |
| 5,849,136 | 11/1998 | Mintz et al. ......................... 156/345 |
| 6,097,157 | * 8/2000 | Overzet et al. ................. 315/111.21 |
| 6,156,667 | * 12/2000 | Jewett ................................. 438/715 |

* cited by examiner

*Primary Examiner*—Don Wong
*Assistant Examiner*—Jimmy Vu
(74) *Attorney, Agent, or Firm*—Larry Williams

(57) ABSTRACT

Plasma processing is carried out in an apparatus having improved stability and reliability for plasma ignition. The improved plasma ignition characteristics result from a modified RF induction coil. One or more nonresonant sections have been added to the RF power induction coil. The nonresonant sections generate enhanced electric fields for igniting the plasma.

31 Claims, 8 Drawing Sheets

METHODS AND APPARATUS FOR IGNITING AND SUSTAINING INDUCTIVELY COUPLED PLASMA

CROSS-REFERENCES

The present application claims the benefit of U.S. Provisional Patent Application No. 60/174,110, filed on Dec. 31, 1999. The present application is related to U.S. patent application Ser. No. 09/476020, filed on Dec. 31, 1999 U.S. Provisional Patent Application No. 60/174,110, entitled "Methods and Apparatus for Process Operations with RF Power" by Russell F. Jewett and Curtis C. Camus filed on Dec. 31, 1999, U.S. Patent Application No. 09/490,128, entitled "Methods and Apparatus for RF Power Process Operations with Automatic Input Power Control" filed on Jan. 24, 2000, and U.S. Patent Application No. 09/490,496 entitled "Methods and Apparatus for Plasma Processing" by Russell F. Jewett, filed on Jan. 24, 2000 now U.S. Pat. No. 6,156,667. All of these applications are incorporated herein by this reference.

BACKGROUND

This invention relates to improved methods and apparatus for igniting and sustaining inductively coupled plasmas produced from radio frequency (RF) power for process operations.

RF plasma is extensively used in a wide variety of applications for carrying out process operations. For example, thermal plasmas can be used to promote chemical reactions because of the high temperatures of the thermal plasma. Alternatively, thermal plasmas are able to promote chemical reactions because of the ability of the energetic electrons to break chemical bonds and allow chemical reactions to occur that would proceed with difficulty under non-plasma conditions.

In other applications, RF power is used to produce non-thermal plasmas, also referred to as non-equilibrium plasmas. The manufacture of semiconductor devices is one area in which non-thermal plasmas are extensively used. During the manufacture of semiconductor devices, etch processes involving RF plasmas and deposition processes involving RF plasmas are used repeatedly during the fabrication process. One of the main benefits of using the non-thermal plasma is the ability of the non-thermal plasma to stimulate chemical reactions that would otherwise require temperatures that are too high for use in the fabrication of semiconductor devices.

RF non-thermal plasmas are also used in cleaning processes in manufacture of semiconductor devices. The non-thermal plasmas are commonly used to strip photoresist materials from semiconductor wafers as part of post etch wafer clean procedures. Resist material is stripped from the surface of the wafers by creating a non-thermal plasma in a gas containing oxidizing species such as oxygen and possibly halogen species that are capable of reacting with and volatilizing the resist material. In some applications, the non-thermal plasma is maintained at a position upstream of the wafer. Reactive species generated in the non-thermal plasma flow downstream and react with the wafer surface for the stripping process. Another cleaning process that uses non-thermal plasmas is the cleaning of reaction chambers used in semiconductor manufacturing.

RF plasmas have also been used for decomposition of chemical compounds that are hazardous or otherwise undesirable. Some of the compounds are highly refractory in nature and are difficult to decompose. Examples of compounds that have been decomposed or abated with plasmas include chlorofluorocarbons (CFC) and perfluorocompounds (PFC).

One frequently encountered problem with standard inductively coupled RF plasma systems is the difficulty of igniting and sustaining the plasma. Plasma ignition is unreliable because coupling an ignition voltage high enough to generate the energetic species needed to produce the plasma is difficult. The voltage required to generate the energetic species is frequently referred to as the breakdown voltage. The breakdown voltage for a gas depends upon a variety of factors. Two major factors are the pressure of the gas and the electronic properties of the gas such as the electronegativity of the gas and its plasma products. The absolute value of the magnitude of the breakdown voltage undergoes a minimum with respect to the pressure of the gas. Specifically, the magnitude of the breakdown voltage increases for plasma ignition at pressures higher or lower than the pressures at which the minimum breakdown voltage occurs. Consequently, igniting plasmas at very low pressures and at high pressures is difficult. The electronegativity of the gas affects the magnitude of the breakdown voltage so that the gas with higher electronegativity requires higher breakdown voltages at every pressure.

Unfortunately for standard inductively coupled plasma technology, the absence of strong electric fields and the absence of strong capacitive coupling make it difficult to overcome the plasma ignition problems resulting from gas pressure and gas electronegativity. At pressures that are too high or too low or for gases with high electronegativities, the required breakdown voltage may equal or exceed the capacity of the RF power source, making plasma ignition unreliable. As a result, it may be necessary to make several attempts to ignite the plasma, greatly reducing the productivity and efficiency of the plasma process. The unreliable plasma ignition can waste valuable process gases, can increase pollution problems, and can ruin valuable product In addition to the problem of igniting the plasma, there is also the problem of poor plasma stability. After the plasma has been ignited it is possible for the plasma to go out, i.e. become extinguished, because of changes in RF power delivery conditions. For instance, the plasma can go out while performing a process and cause the same unfortunate results that occur for unreliable plasma ignition.

Clearly, there are numerous applications requiring reliable and efficient methods and apparatus for igniting and sustaining inductively coupled RF plasmas. Unfortunately, typical methods and apparatus for old-style inductively coupled RF plasma systems have characteristics that are undesirable for some applications. There is a need for methods and apparatus for igniting and sustaining inductively coupled RF plasmas that are simple to use, operate automatically, and provide high reliability.

SUMMARY

This invention seeks to provide methods and apparatus that can overcome deficiencies in known RF power inductively coupled plasma technology. One aspect of the present invention includes methods and apparatus for igniting and sustaining an inductively coupled RF powered plasma. The methods and apparatus make it easier to ignite and sustain the RF plasma and can provide greater reliability and greater stability than is typical for standard RF plasma technology. The apparatus has features built in that automatically facilitate igniting and sustaining the plasma. The methods and apparatus are simple to use, operate automatically, and provide high reliability.

In one embodiment, the apparatus comprises a load such as a plasma chamber capable of receiving gases for generating a plasma, an RF power source, and an RF power antenna such as a RF power induction coil. The RF power induction coil is positioned near the plasma chamber so the induction coil can couple RF power to the plasma. The resonant section is connected with the RF power source to receive RF power from the RF power source. At least one non-resonant section is electrically attached to a location on the resonant section. Application of a substantially steady-state magnitude of RF power to the resonant section of the RF coil produces a high current in the resonant section in the absence of the plasma. In addition, the at least one nonresonant section maintains high voltages that produce an enhanced electric field in the plasma chamber. The enhanced electric field in the plasma chamber facilitates igniting the plasma. After the plasma has been ignited, the plasma is sustained by inductive coupling of the RF power to the plasma. Inductive coupling of RF power to the plasma causes the current in the resonant section to decrease. The decrease in the current in the resonant section causes the voltages in the at least one nonresonant sections to decrease and maintain lower voltages. Consequently, after the plasma is ignited, the plasma is sustained by inductive coupling of RF power from the resonant section, and the nonresonant sections do not contribute significant amounts of power to the plasma.

A further embodiment of the present invention includes a control system responsive to the presence or absence of the plasma when RF power is applied to the resonant section of the coil. The control system sends a signal to the RF power source if the plasma is absent while RF power is been applied to the resonant section. The signal commands the RF power source to provide an output RF power pulse to the resonant section. The magnitude of the output RF power pulse is substantially greater, preferably at least five percent greater, than the steady state output RF power. More preferably, the magnitude of the RF power pulse is five times greater than the rated steady-state RF power output for the RF power source. The steady-state output RF power refers to the RF power magnitude selected for a particular process as a selected process parameter. Whereas, the rated steady-state RF output is a characteristic of the RF power source specified by the manufacturer of the RF power source.

In alternative embodiments of the present invention, the resonant section may have any shape suitable for inductively coupling RF power to the plasma. Examples of suitable shapes for the resonant section are cylindrical coils, planar coils, cylindrical coils having varying diameters for the coil turns, and coils shaped like domes, partial spheres, or cones. In addition, the nonresonant sections may include shapes other than coil turns. The nonresonant sections can comprise any shape suitable for an electrical conductor such as sheets, plates, strips, hollow cylinders, cylindrical coils, planar coils, grids, applied film, and deposited film.

Another aspect of the present invention includes a method of igniting and sustaining an inductively coupled RF power plasma. In one embodiment, the method includes multiple steps. One step includes providing an ionizable gas. Another step involves providing an RF power induction coil having a resonant section and providing at least one nonresonant section, electrically connected with the resonant section. Yet another step includes providing a steady-state magnitude of RF power to the resonant section of the coil so the at least one nonresonant section of the coil maintains a high voltage in the absence of the plasma. The at least one nonresonant section of the coil produces an enhanced electric field in the gas when the plasma is absent. The enhanced electric field facilitates igniting the plasma. The method further includes continuing to apply the steady-state magnitude of RF power to the resonant section so the at least one nonresonant section maintains a reduced voltage when the plasma is present; and, inductively coupling RF power from the resonant section to the plasma at about the steady-state magnitude of RF power output.

A further aspect of the method includes an additional step to facilitate igniting the plasma. The additional step includes providing a pulse of output RF power if the plasma is absent while the steady-state RF power is applied to the resonant section. The pulse of output RF power has a magnitude substantially greater than the magnitude of the steady-state RF power, preferably at least five percent greater than the steady-state RF power output.

In various separate embodiments of the present invention, the load that receives the RF power may use the RF power for different applications. Exemplary functions of the loads for various applications are as follows. The load may absorb the RF power to produce a thermal plasma such as those used for chemical processing, materials processing, analytical chemistry, or driving optical devices. The load may absorb the RF power to produce a non-thermal plasma such as those used for chemical processing or materials processing. The load may absorb RF power to produce non-thermal plasmas such as plasmas used for semiconductor device fabrication processes like etching, deposition, cleaning, doping, oxidation, drying, photoresist stripping, parts cleaning, reaction chamber cleaning, and annealing. The load may absorb RF power to produce a plasma for stimulating chemical reactions that cannot proceed or proceed slowly under non-plasma conditions. The load may absorb RF power to produce a plasma for decomposing chemical compounds. The load may absorb RF power to produce a plasma for synthesizing chemical compounds.

In another aspect of the present invention, the delivered RF power is used for abatement of gaseous halogenated organic compounds, other refractory organic compounds, perfluorocompounds, and refractory inorganic compounds. The apparatus uses a non-thermal plasma, generated by RF power, for creating free radicals in a dielectric reaction chamber. In a further aspect of the present invention, the treatment of gases is enhanced by the addition of suitable ancillary reaction gases including water, methane, hydrogen, ammonia, hydrogen peroxide, oxygen, or mixtures thereof.

Embodiments of the present invention provide methods and apparatus for generating plasmas.

Embodiments of the present invention provide methods and apparatus for generating thermal plasmas.

Embodiments of the present invention provide methods and apparatus for generating non-thermal plasmas.

Embodiments of the present invention provide methods and apparatus for RF power delivery for promoting chemical reactions.

Embodiments of the present invention provide methods and apparatus for generating plasmas for semiconductor device fabrication steps such as etching, deposition, cleaning, doping, oxidation, drying, photoresist stripping, parts cleaning, reaction chamber cleaning, and annealing. In one embodiment, the plasma generation and the semiconductor device fabrication step occur in the same chamber. In an alternative embodiment, the plasma generation occurs at the plasma location and reactive species from the plasma are transported to another chamber for the semiconductor device fabrication step. In one embodiment, the plasma chamber is connected with a semiconductor process tool so that the process tool receives reactive species from the plasma.

Embodiments of the present invention provide methods and apparatus for removal of refractory compounds from waste streams. Refractory compounds include compounds that show a high degree of stability with respect to temperature and reactivity and are difficult to decompose.

Embodiments of the present invention provide new and useful methods and apparatus for the destruction of refractory compounds such as perfluorocompounds, such as carbon fluorides, carbon tetrafluoride, nitrogen triflouride, and sulfur hexafluoride by reactions facilitated by a plasma.

Embodiments of the present invention provide methods and apparatus for gas waste treatment using a non-thermal plasma generated by RF power.

Embodiments of the present invention provide methods and apparatus that are suitable for processing waste streams emanating from one or more individual semiconductor process tools and the apparatus can become an integral part of the semiconductor device fabrication process. In one embodiment, the apparatus is connected with semiconductor process tools such as chemical vapor deposition tools, plasma etching tools, plasma cleaning tools, doping tools, photoresist stripping tools, and plasma deposition tools.

An advantage of embodiments of the present invention is the ability to provide an economical apparatus and method for the destruction of refractory compounds contained in gaseous waste streams.

Another advantage of embodiments of the present invention is the ability to provide waste treatment of undiluted off gases from individual semiconductor device fabrication tools. Embodiments of the present invention can be made compact enough to be integrated into and attached directly to one or more than one wafer processing tools.

The above and still further features and advantages of the present invention will become apparent upon consideration of the following detailed descriptions of specific embodiments thereof, especially when taken in conjunction with the accompanying drawings.

DESCRIPTION

Figure 1:
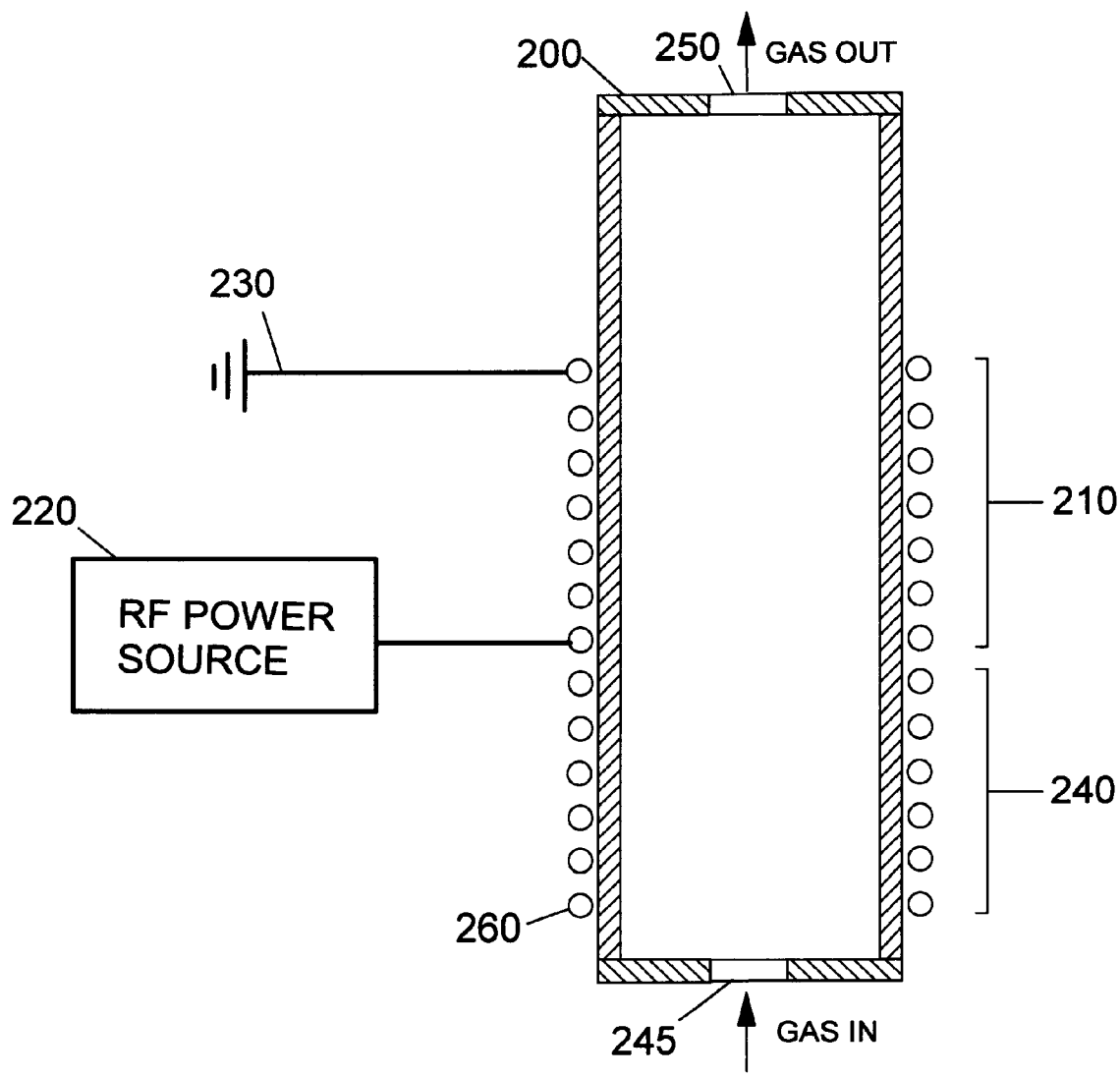
FIG. 1 is a schematic block diagram of a first embodiment of the present invention.

Reference is now made to FIG. 1 wherein there is a plasma chamber 200 shown in cross-section. An RF power induction coil having a resonant section 210 is shown wound around plasma chamber 200. Resonant section 210 is shown in cross-section. An RF power source 220 is connected with resonant section 210. An electrical ground connection 230 is connected with resonant section 210. A nonresonant section 240 is shown in cross-section as a section of coil electrically connected with resonant section 210. Nonresonant section 240 makes electrical contact with resonant section 210 so that charge flow, or rather current, to and from nonresonant section 240 only occurs via the electrical contact with resonant section 210. Specifically, nonresonant section 240 does not have a ground or other type of electrical connection between the connection with resonant section 210 and the end 260 of the nonresonant section 240. The end 260 of nonresonant section 240 is ungrounded.

Plasma chamber 200 has an opening 245 capable of allowing gas into the plasma chamber. Plasma chamber 200 also has an opening 250 capable of allowing gas removal from plasma chamber 200. Plasma chamber 200 includes materials that are substantially transparent to RF power so that RF power can be coupled to the interior of the plasma chamber so as to ignite and sustain a plasma.

RF power source 220 may be connected with resonant section 210 via a standard RF match network, not shown, for matching the impedance of RF power source 220 so that RF power can be coupled to gas in plasma chamber 200 to generate the plasma.

The design of resonant coils for coupling RF power to a load is well known in the art. Typical resonant coils have at least a tenth of a coil turn, i.e. a 36-degree segment, more typically, at least one coil turn, i.e. a 360-degree segment, and frequently multiple coil turns. The resonant coil is designed to have an inductance that allows resonant coupling of RF power to the plasma. In a preferred embodiment, resonant section 210 has multiple coil turns.

Nonresonant section 240 is electrically conductive. In a preferred embodiment, nonresonant section 240 is made of the same material as resonant section 210. Furthermore, nonresonant section 240 may have a variety of structural designs. In one embodiment, nonresonant section 240 has at least one coil turn for cylindrical coils, but more preferably, nonresonant section 240 has multiple coil turns for cylindrical coils.

The embodiment shown in FIG. 1 can facilitate igniting and sustaining an inductively coupled RF power plasma. Application of a steady-state magnitude of output RF power to resonant section 210 produces a high current in resonant section 210 in the absence of the plasma. The high current causes nonresonant section 240 to maintain high voltages that produce an enhanced electric field in the plasma chamber. The enhanced electric field in the plasma chamber facilitates igniting the plasma. Inductive coupling of RF power to the plasma causes the current in resonant section 210 to decrease. The decrease in the current in resonant section 210 causes the voltages in nonresonant section 240 to decrease. After the plasma is ignited, the plasma is sustained by inductive coupling of RF power from resonant section 210. Nonresonant section 240 does not contribute significant amounts of RF power to the plasma; substantially all of the RF power to the plasma is inductively coupled.

Figure 2:
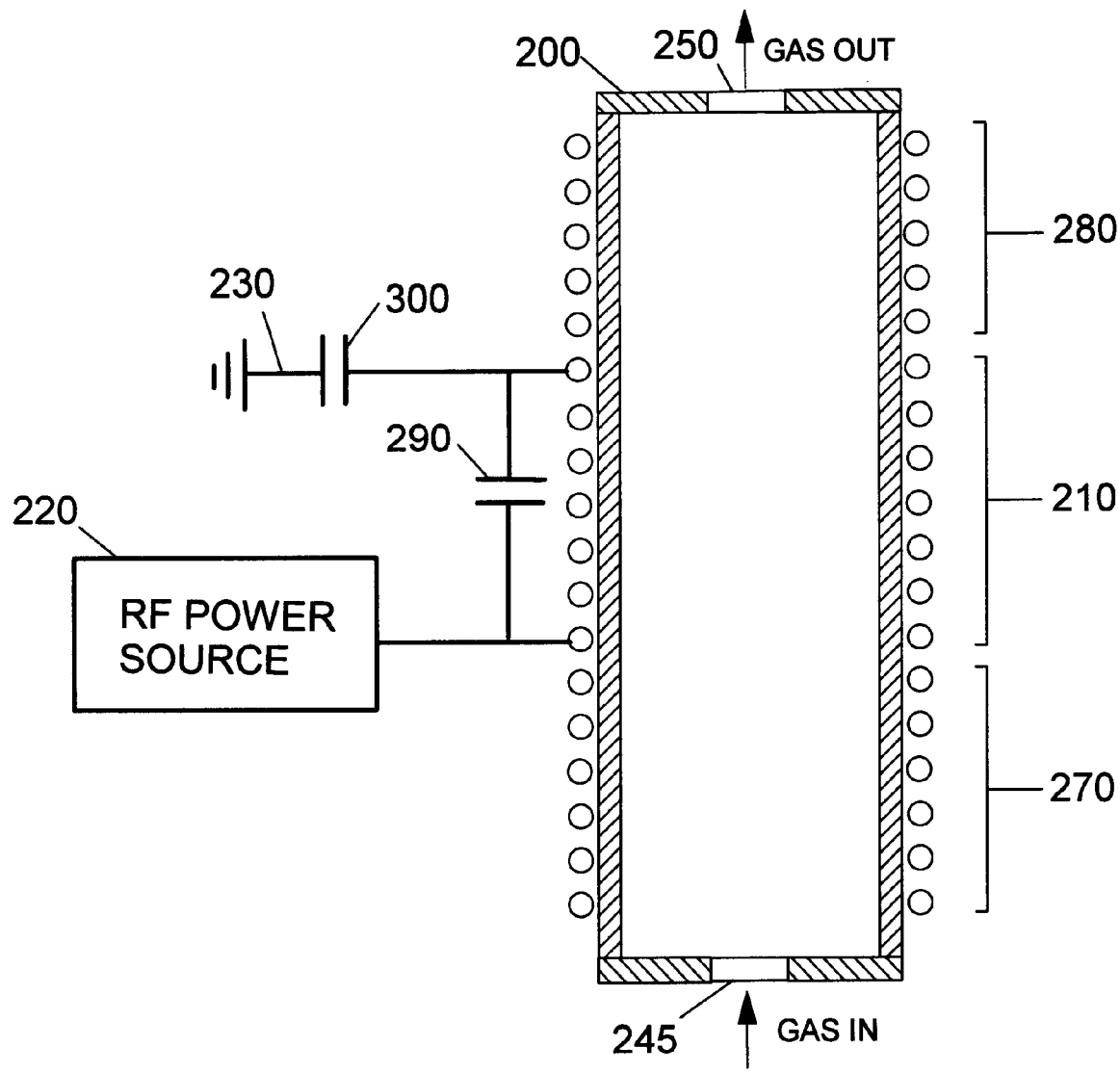
FIG. 2 is a schematic block diagram of a second embodiment of the present invention.

Reference is now made to FIG. 2 wherein there is a plasma chamber 200 shown in cross-section. An RF power induction coil having a resonant section 210 is shown wound around plasma chamber 200. Resonant section 210 is shown in cross-section. An RF power source 220 and an electrical ground connection 230 are connected with resonant section 210 via a parallel capacitor 290 and a series capacitor 300 so as to allow application of RF power to resonant section 210.

A first nonresonant section 270 is shown in cross-section as a section of coil. First nonresonant section 270 is electrically connected with resonant section 210 at a first location. A second nonresonant section 280, also shown in cross-section as a section of coil, is electrically connected with resonant section 210 at a second location so that first nonresonant section 270 and second nonresonant section 280 will be at different voltages when RF power is applied to resonant section 210. For the embodiment shown in FIG. 2, the first location and the second location are at the two ends of resonant section 210 so that resonant section 210, first nonresonant section 270, and second nonresonant section 280 form a continuous cylindrical coil wound around plasma chamber 200.

First nonresonant section 270 and second nonresonant section 280 are electrically connected to resonant section 210 so that charge flow, or rather current, to and from first nonresonant section 270 and second nonresonant section 280 only occurs via the connection with resonant section 210. Specifically, nonresonant section 270 and nonresonant section 280 do not have an electrical ground or other type of electrical connection other than the connection with resonant section 210.

The embodiment shown in FIG. 2 can facilitate igniting and sustaining an inductively coupled RF power plasma. Application of a steady-state magnitude of output RF power to resonant section 210 produces a high current in resonant section 210 in the absence of the plasma. The high current causes first nonresonant section 270 and second nonresonant section 280 to maintain a high voltage difference that produces an enhanced electric field in the plasma chamber. The enhanced electric field in the plasma chamber facilitates igniting the plasma. Inductive coupling of RF power to the plasma causes the current in resonant section 210 to decrease. The decrease in the current in resonant section 210 causes the voltage difference between first nonresonant section 270 and second nonresonant section 280 to decrease. After the plasma is ignited, the plasma is sustained by inductive coupling of RF power from resonant section 210. First nonresonant section 270 and second nonresonant section 280 do not contribute significant amounts of RF power to the plasma; substantially all of the RF power to the plasma is inductively coupled.

An advantage that results from having two nonresonant sections instead of a single nonresonant section is that two nonresonant sections produce a more enhanced electric field for igniting the plasma.

The enhanced electric field generated by nonresonant sections such as nonresonant section 240 (FIG. 1) and nonresonant sections 270 and 280 (FIG. 2) allow plasma ignition to occur under conditions that would make plasma ignition extremely difficult without the benefit of the enhanced electric field. For example, the embodiments shown in FIG. 1 and FIG. 2 make it easier to ignite and sustain a plasma over a large range of pressures. Low-pressure plasmas such as those operating at below 100 milliTorr can be ignited more easily using the embodiments shown in FIG. 1 and FIG. 2. In addition, higher-pressure plasmas such as those operating in the range of one hundred milliTorr to about one atmosphere can be ignited more easily using embodiments of the present invention. A suitable range of pressures for using embodiments of the present invention is from about five milliTorr to about one atmosphere, including all pressures and ranges of pressures subsumed therein. A preferred range of pressures for using embodiments of the present invention is the range from about 100 milliTorr to about 10 Torr.

In addition to facilitating plasma ignition under extreme pressure conditions, the embodiments shown in FIG. 1 and in FIG. 2 are also useful in igniting plasmas when the plasma chamber is substantially incapable of supporting capacitively coupled RF power. Capacitively coupling RF power to a plasma chamber is extremely difficult if the plasma chamber is substantially all dielectric. Such a situation can occur when there is insufficient electrically grounded surface in the plasma chamber that can support capacitive coupling of RF power. In addition, capacitively coupling RF power to a plasma chamber is extremely difficult if the plasma chamber is designed so that grounded surfaces that may be exposed to the plasma are far away from the resonant section of the RF induction coil; the plasma ignition will be very difficult because of the very long discharge length. Discharge length is interpreted to mean the distance between the resonant section of the RF coil and the electrically grounded surface inside the chamber. The enhanced electric fields, as described for FIG. 1 and FIG. 2, can facilitate plasma ignition for plasma chambers having poor capacitive coupling characteristics. Using two nonresonant sections as described for FIG. 2 is especially beneficial because of the more enhanced electric field.

Figure 3A:
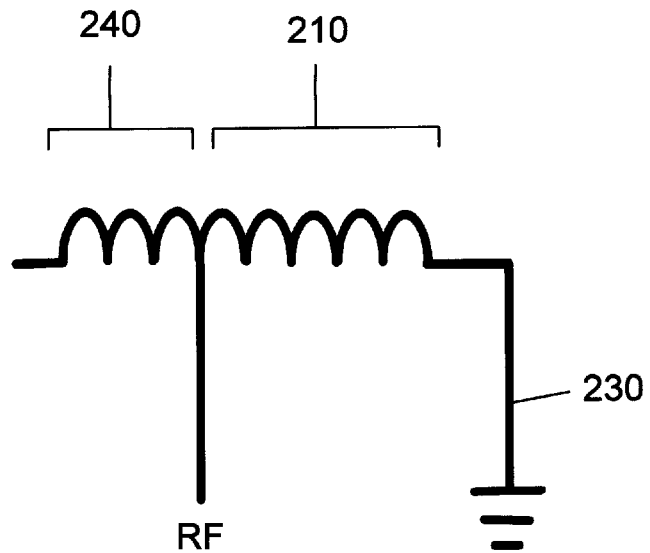
FIG. 3 is an equivalent circuit diagram of embodiments of the present invention.

Reference is now made to FIG. 3 wherein there are shown equivalent circuits for embodiments of the present invention having one nonresonant section. FIG. 3A shows the equivalent circuits for resonant section 210 and nonresonant section 240. Non-resonant section 240 is a coil as described earlier. Note that the nonresonant section 240 is electrically connected only with resonant section 210. Resonant section 210 is connected across the RF power source and ground connection 230.

Figure 3B:
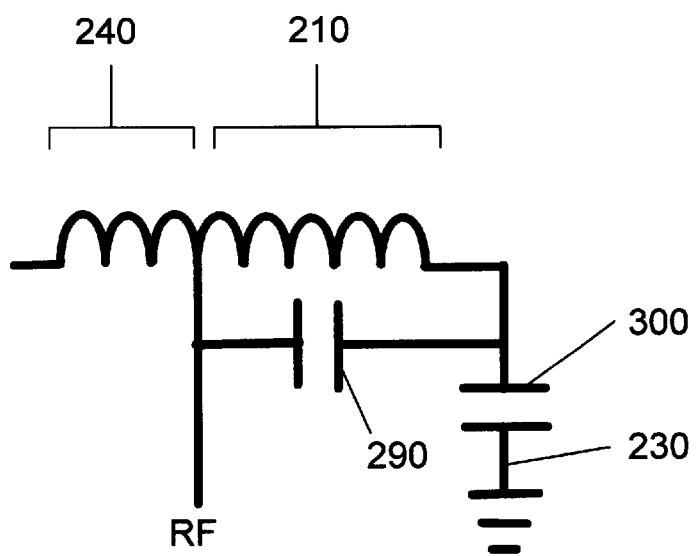

FIG. 3B shows resonant section 210 connected with the RF power source and electrical ground connection 230 via parallel capacitor 290 and series capacitor 300. Non-resonant section 240 is connected with resonant section 210.

Figure 4A:
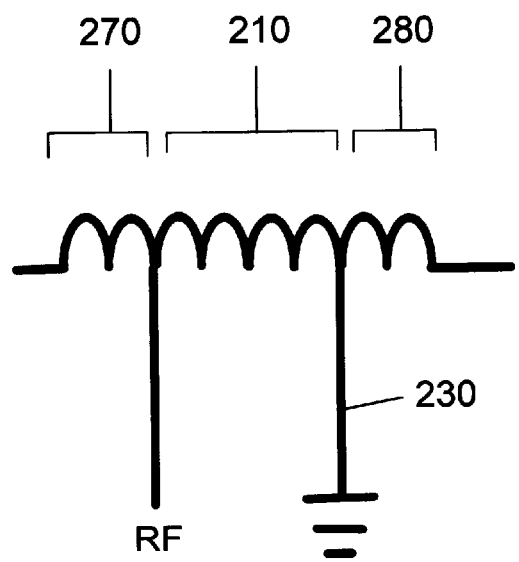
FIG. 4 is another equivalent circuit diagram of embodiments of the present invention.

Reference is now made to FIG. 4 wherein there are shown equivalent circuits for embodiments of the present invention having two nonresonant sections. FIG. 4A shows resonant section 210 connected across an RF power input and electrical ground connection 230. First nonresonant section 270 is connected with resonant section 210. Second nonresonant section 280 is connected with resonant section 210.

Figure 4B:
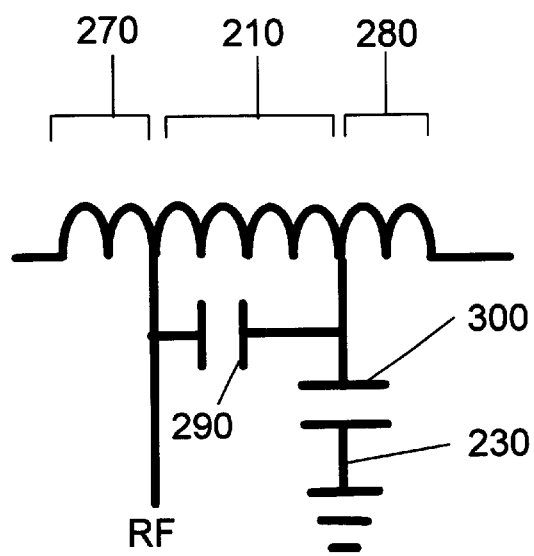

FIG. 4B shows resonant section 210 connected with the RF power source and electrical ground connection 230 via parallel capacitor 290 and series capacitor 300. First nonresonant section 270 is connected with resonant section 210. Second nonresonant section 280 is connected with resonant section 210.

Reference is now made to FIG. 5 wherein there are shown examples of alternative configurations for resonant and nonresonant sections for embodiments of the present invention.

Figure 5A:
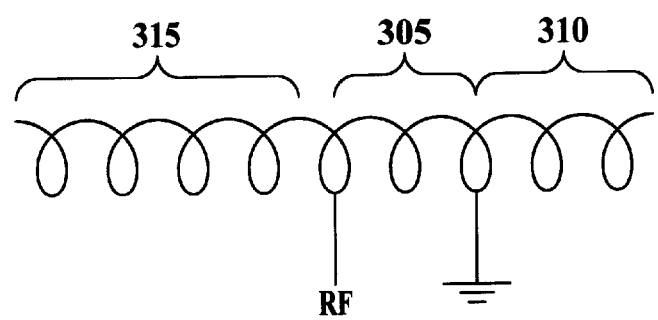
FIG. 5 is a diagram of several example configurations suitable for use with embodiments of the present invention.

FIG. 5A shows a resonant section 305 connected with a first nonresonant section 310 and a second nonresonant section 315. The number of coil turns in nonresonant section 310 is not equal to the number of coil turns in nonresonant section 315. As another embodiment, the nonresonant sections may have an equal number of coil turns.

Figure 5B:
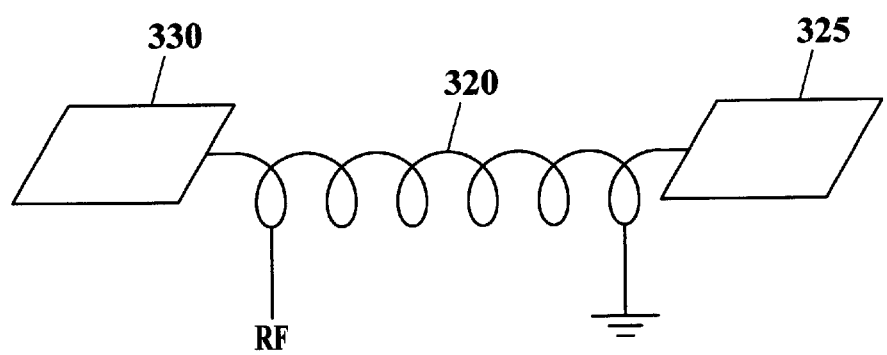

FIG. 5B shows a resonant section 320 connected with a first nonresonant section 325 and a second nonresonant section 330. First nonresonant section 325 and second nonresonant section 330 each comprise a substantially flat electrical conductor.

Figure 5D:
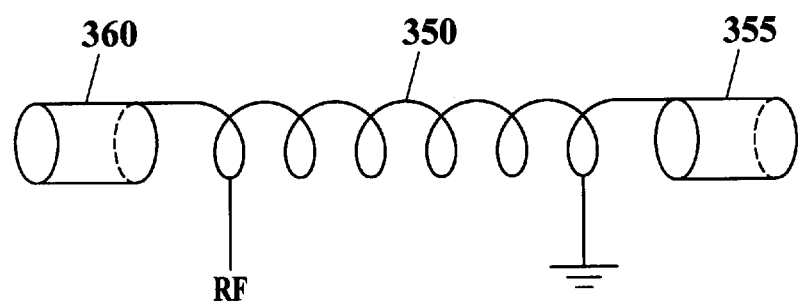
Figure 5C:
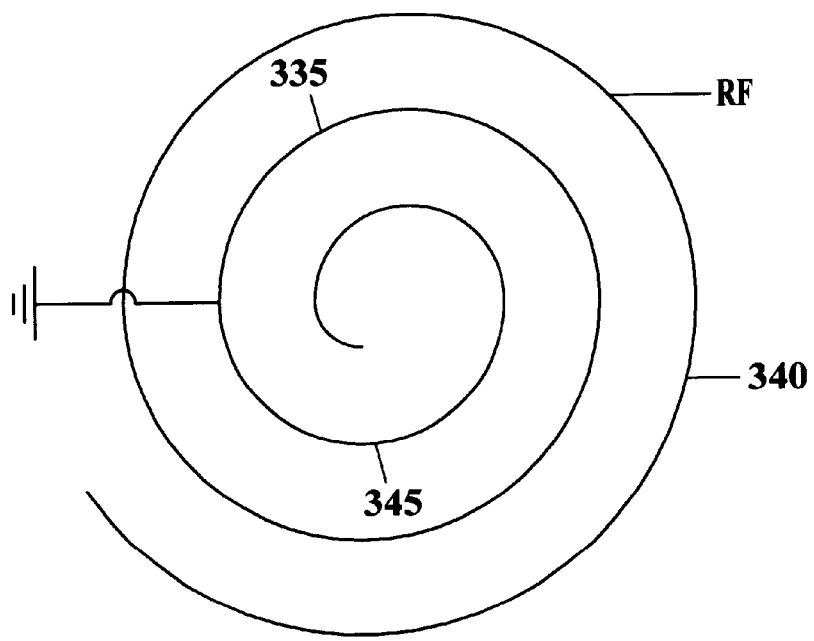

FIG. 5C shows a substantially planar RF power induction coil having a resonant section 335. A first nonresonant section 340 and a second nonresonant section 345 are connected with resonant section 335.

FIG. 5D shows a first resonant section 350. A first nonresonant section 355 is a hollow cylinder connected with resonant section 350. A second nonresonant section 360 is also a hollow cylinder connected with resonant section 350.

Figure 5E:
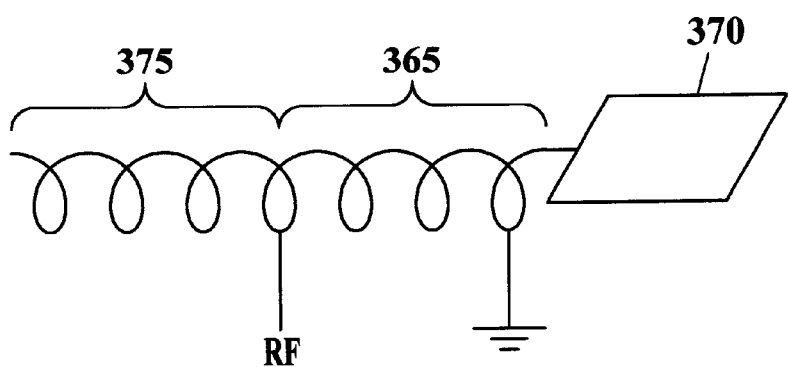

FIG. 5E shows and example of how different types of nonresonant sections can be combined. A resonant section 365, a first nonresonant section 370, and a second nonresonant section 375 are connected. First nonresonant section 370 is a substantially flat electrical conductor. Second nonresonant section 375 is a cylindrical coil.

Figure 5F:
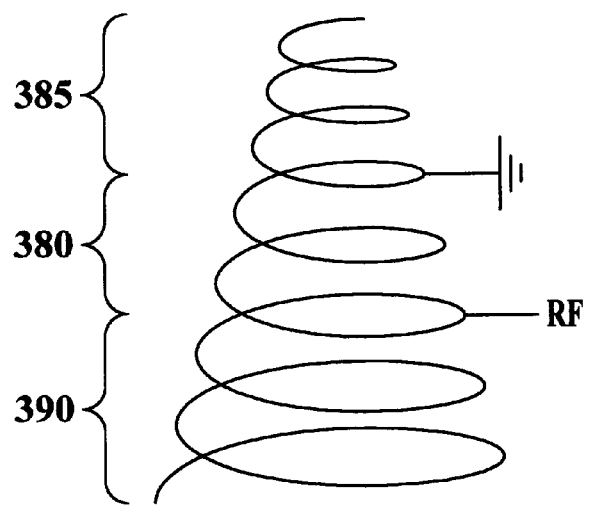

FIG. 5F shows a resonant section 380, a first nonresonant section 385, and the second nonresonant section 390 wherein each section is part of a nonplanar coil having varying diameters for the coil turns.

Figure 5G:
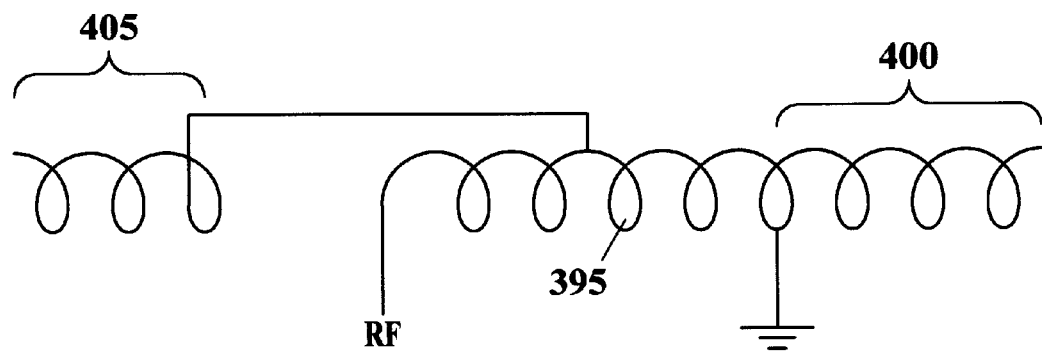

FIG. 5G shows a resonant section 395. A first nonresonant section 400 is connected with one end of resonant section 395. A second nonresonant section 405 is connected with resonant section 395 at a location near the middle of resonant section 395.

Figure 6:
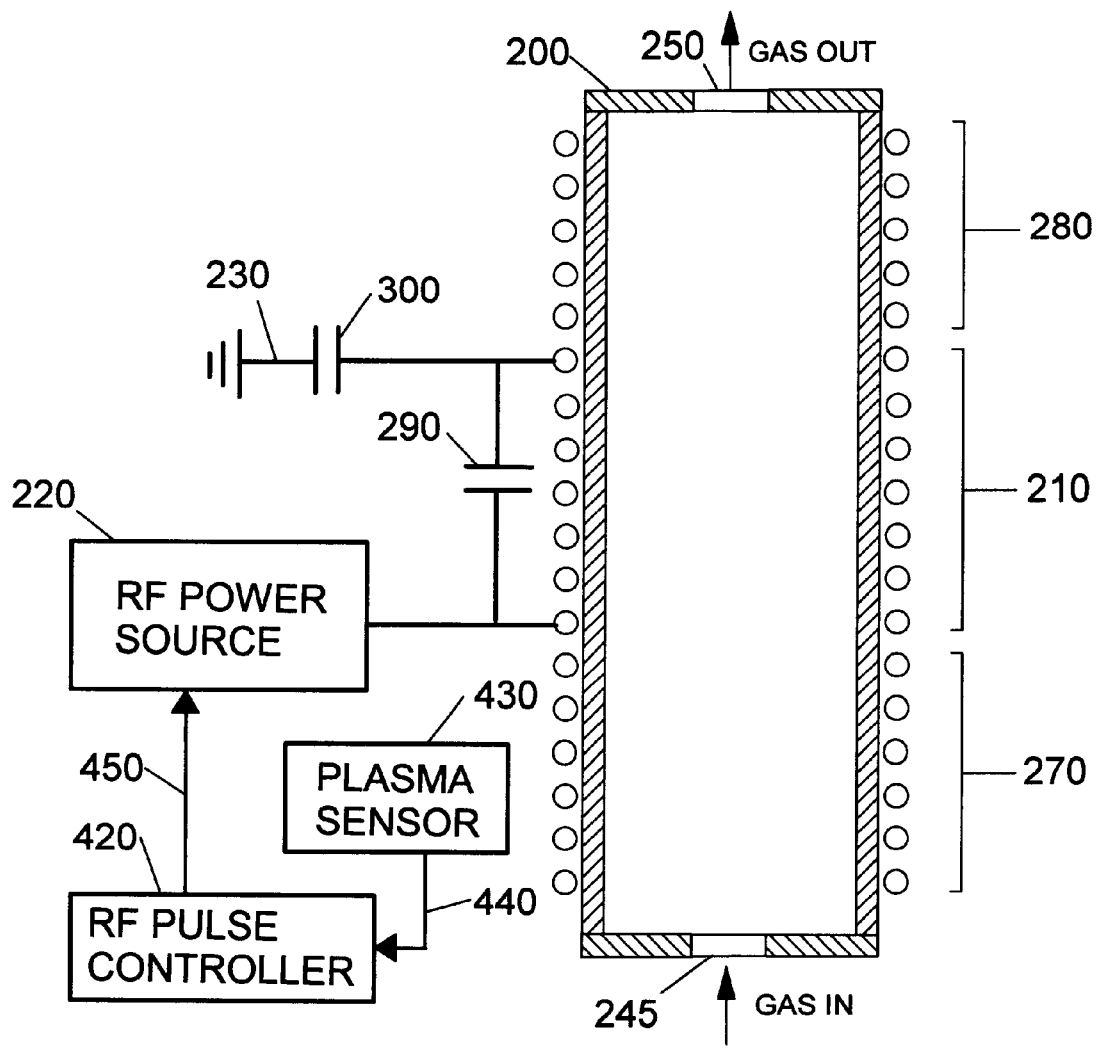
FIG. 6 is a schematic block diagram of an embodiment of the present invention including RF pulse capability.

Reference is now made to FIG. 6 wherein there are shown all of the items shown and described for FIG. 5. FIG. 6 also shows an RF pulse controller 420 and a plasma sensor 430. Plasma sensor 430 is positioned so as to be able to detect whether there is a plasma in the chamber. Plasma sensor 430 provides a plasma status signal 440 to RF pulse controller 420. RF pulse controller 420 sends an RF power pulse command 450 to RF power source 220 if there is no plasma in plasma chamber 200 while RF power is being applied to resonant section 210. RF power pulse command 450 causes RF power source 220 to provide a pulse of output RF power that is substantially greater in magnitude than the steady-state output RF power. The magnitude of the output RF power pulse ranges from about 5 percent greater than the steady-state output RF power to about the maximum output power that RF power source 220 is capable of providing, including all RF power levels subsumed therein. A preferred range for the RF power pulse is from about 5 percent greater than the steady-state output RF power to about five times the rated steady-state output RF power for the RF power source.

Plasma sensor 430 is capable of detecting plasma by measuring one or more properties of the plasma or one or more characteristics of the RF power delivery. For example, plasma sensor 430 may use one or more of the following examples of measurements for detecting plasma: light emission, forward RF power, reflected RF power, standing wave ratio, RF voltage at the resonant section, RF current at the resonant section, voltage at the nonresonant section, thermal emission, electrical conductivity, electrical charging, impedance, capacitance, inductance, chemical reaction products, and chemical species. The position of plasma sensor 430 with respect to the plasma chamber depends upon the type of measurements that plasma sensor 430 uses. RF pulse controller 420 provides a time delay before the RF power pulse is applied to resonant section 210. The time delay is provided to allow an opportunity for plasma ignition without using the RF power pulse. Preferably, the time delay is greater than 0 seconds and less than about 10 seconds, including all times subsumed therein. More preferably, the time delay is greater than 0 seconds and less than about 1 second.

Another characteristic of RF pulse controller 420 is that it is capable of sending the RF power pulse command 450 if needed in the event that the plasma is unintentionally extinguished during processing.

RF pulse controller 420 is shown in FIG. 6 as a separate controller. In alternative embodiments, the RF power pulse control can be performed by a controller integrated into a control system used by the RF power source. In other words, it is not a requirement for embodiments of the present invention to use a separate controller for RF power pulse control. The types of controllers that may be used are purely a matter of designer choice.

Plasma sensing capabilities for embodiments of the present invention may use a single independent plasma sensor as shown for plasma sensor 430 in FIG. 6. However, other embodiments of the present invention may combined the plasma sensing function with sensors that may already be included with the RF power source for controlling the RF power delivery.

RF power source 220 may be a fixed frequency RF power source. In a preferred embodiment, RF power source 220 is a variable frequency RF power source.

There are numerous techniques for applying RF power to a resonant coil such as the resonant section described above. The arrangement of capacitors shown in FIG. 2 and FIG. 6 is but one of many possible examples.

A variety of shapes can be used for the nonresonant sections. In a preferred embodiment, the nonresonant sections are shaped as coils positioned around at least part of the plasma chamber. In another preferred embodiment, the nonresonant sections are hollow cylinders positioned around at least part of the plasma chamber. It may be speculated that using nonresonant sections that are coils or hollow cylinders may have a more pronounced effect in igniting plasmas.

In a preferred embodiment, the resonant section is a cylindrical coil having from about 2 to about 8 coil turns. In addition, the nonresonant section has from about 2 to about 8 coil turns.

In one embodiment, the plasma chamber comprises a ceramic that is substantially transparent to RF power. Examples of suitable ceramics include alumina, magnesia, silica, carbides, nitrides, oxides, aluminum nitride, silicon nitride, sapphire, and mixtures or derivatives thereof. In a preferred embodiment, the plasma chamber comprises a ceramic tube capable of receiving gases for plasma processing.

Alternatively, embodiments of the present invention can be applied to plasmas operating at pressures other than low pressure, such as at about atmospheric pressure. Plasmas operating at atmospheric pressure, optionally, may be open to the atmosphere. An embodiment of the present invention is to generate a plasma open to the atmosphere without significant confinement of the plasma except the confinement determined by the RF power coupling element.

While there have been described and illustrated specific embodiments of the invention, it will be clear that variations in the details of the embodiments specifically illustrated and described may be made without departing from the true spirit and scope of the invention as defined in the appended claims and their legal equivalents.

What is claimed is:

1. An apparatus for generating plasma in a gas for plasma processing using inductively coupled RF power, the apparatus comprising:

an RF power source;

an RF power induction coil having a resonant section, the resonant section comprising at least a tenth of a coil turn the resonant section being connected with the RF power source for receiving RF power, the resonant section being disposed so as to couple RF power to the gas;

at least one nonresonant section, the nonresonant section being electrically conductive, the nonresonant section being electrically connected with a location on the resonant section; and whereby, a substantially constant input of RF power to the resonant section of the RF coil, in the absence of the plasma, causes the at least one nonresonant section to maintain voltages that create an enhanced electric field in the gas so that the enhanced electric field facilitates igniting the plasma, and, when the plasma is present, the input of RF power causes the at least one nonresonant section to maintain lower voltages and the plasma is sustained by inductive coupling of RF power from the resonant section.

2. The apparatus of claim 1 further comprising a plasma chamber, the plasma chamber being capable of receiving the gas, wherein the plasma chamber comprises a material substantially transparent to radio frequency power.

3. The apparatus of claim 2 wherein the plasma chamber is substantially incapable of receiving capacitively coupled RF power.

4. The apparatus of claim 2 wherein substantially all of the plasma chamber is electrically floating.

5. The apparatus of claim 4 wherein the at least one nonresonant section is electrically connected with only the resonant section.

6. The apparatus of claim 5 wherein the resonant section is a cylindrical coil surrounding the plasma chamber.

7. The apparatus of claim 6 wherein the at least one nonresonant section is a cylindrical coil surrounding the plasma chamber.

8. The apparatus of claim 5 wherein the at least one nonresonant section comprises a number of coil turns greater than or equal to the number of coil turns in the resonant section.

9. The apparatus of claim 5 wherein the at least one nonresonant section comprises fewer coil turns than are present in the resonant section.

10. The apparatus of claim 5 wherein the at least one nonresonant section comprises an area of electrical conductor selected from the group consisting of sheets, plates, strips, hollow cylinders, cylindrical coils, planar coils, grids, applied film, and deposited film.

11. The apparatus of claim 2 wherein the RF power source is a variable frequency RF power source.

12. The apparatus of claim 2 further comprising:
a plasma sensor for sensing the plasma while RF power is being applied to the resonant section; and
an RF pulse controller responsive to the plasma sensor, the controller being capable of providing a signal to the RF power source to apply an output RF power pulse to the resonant section when the plasma is absent and RF power is being applied to the resonant section.

13. The apparatus of claim 12 wherein the RF pulse controller is capable of providing a time delay before the RF power source provides the RF power pulse.

14. The apparatus of claim 13 wherein the RF pulse controller is capable of signaling the RF power source to provide the RF power pulse within about 10 seconds of the time that the plasma is determined to be absent while RF power is being applied to the resonant section.

15. The apparatus of claim 12 wherein the plasma sensor is capable of detecting plasma by measuring a property of the plasma or a characteristic of the RF power delivery.

16. The apparatus of claim 15 wherein the plasma sensor is capable of detecting plasma by measuring a property of the plasma selected from the group consisting of light emission, forward power, reflected power, standing wave ratio, RF voltage at the resonant section, RF current at the resonant section, voltage at the nonresonant section, thermal emission, electrical conductivity, electrical charging, impedance, chemical reaction products, and chemical species.

17. The apparatus of claim 14 wherein the RF power source comprises components capable of delivering the output RF power pulse at a magnitude from about 5% greater than the magnitude of the steady-state RF power to about the maximum output power of the RF power source.

18. The apparatus of claim 17 wherein the at least one nonresonant section comprises two nonresonant sections, and the two nonresonant sections are electrically connected to the resonant section at two spaced apart locations on the resonant section.

19. A method of plasma processing using an inductively coupled RF plasma, the method comprising the steps of:
   a) providing an ionizable gas at a location for the plasma;
   b) providing an RF power induction coil having a resonant section disposed so as to couple RF power to the gas;
   c) providing at least one nonresonant section, the nonresonant section being electrically conductive, the nonresonant section being electrically connected to the resonant section;
   d) providing a steady-state magnitude of RF power to the resonant section of the coil so the at least one nonresonant section produces an enhanced electric field at the location for the plasma when the plasma is absent so as to facilitate igniting the plasma;
   e) continuing to apply the steady-state magnitude of RF power to the resonant section so the at least one nonresonant section maintains a reduced voltage when the plasma is present and inductively coupling RF power from the resonant section to the plasma.

20. The method of claim 19 further comprising between step d) and step e) the step of testing for plasma and, in the absence of plasma, providing a pulse of RF power to further facilitate igniting the plasma.

21. The method of claim 20 wherein the magnitude of total RF power applied to the coil during the pulse of RF power is from about 5% greater than the magnitude of the steady-state RF power to about the maximum output power of the RF power source.

22. The method of claim 21 further comprising repeating steps d) through e) when the plasma unintentionally extinguishes.

23. The method of claim 22 wherein the ionizable gas is at a pressure in the range from about 1 milliTorr to about 760 Torr.

24. The method of claim 23 further comprising the step of providing a plasma chamber for containing the plasma.

25. The method of claim 24 wherein the ionizable gas is at a pressure in the range from about 100 milliTorr to about 10 Torr.

26. The method of claim 25 wherein the ionizable gas comprises refractory compounds selected from the group consisting of halogenated organic compounds, refractory organic compounds, perfluorocompounds, and refractory inorganic compounds.

27. The method of claim 26 further comprising the step of providing ancillary reaction gas for abating the refractory compounds.

28. The method of claim 26 wherein the ancillary reaction gas comprises a compound selected from the group consisting of water, methane, hydrogen, ammonia, hydrogen peroxide, and oxygen.

29. The method of claim 19 further comprising the step of connecting the plasma chamber to receive exhaust gases from a semiconductor process tool.

30. The method of claim 19 further comprising the step of connecting the plasma chamber to a semiconductor process tool so that the plasma chamber can provide plasma derived reactive species to the semiconductor process tool.

31. An apparatus for igniting and sustaining an inductively coupled RF power plasma, the apparatus comprising:
a plasma chamber comprising materials substantially transparent to RF power;
an RF power source;
an RF power induction coil near the plasma chamber, the RF power induction coil having a resonant section comprising at least one coil turn and having a first end and a second end opposite the first end, the first end of the resonant section being attached to the RF power source for receiving RF power from the RF power source, the second end of the resonant section being electrically grounded, the RF power induction coil having a first non-resonant section attached to the first end of the resonant section, the RF power induction coil having a second non-resonant section attached to the second end of the resonant section; and
whereby, an input of RF power to the resonant section of the RF coil, in the absence of the plasma, produces a high current in the resonant section and causes the first and second nonresonant sections to maintain high voltage differences producing an enhanced electric field in the plasma chamber to facilitate igniting the plasma, and, in the presence of the plasma, produces a reduced current in the resonant and causes the first and second nonresonant sections to maintain lower voltages so that the plasma is sustained by inductive coupling of RF power from the resonant section.

* * * * *